United States Patent
Lee et al.

(10) Patent No.: US 7,635,859 B2
(45) Date of Patent: Dec. 22, 2009

(54) MEMORY DEVICE INCLUDING DENDRIMER

(75) Inventors: Sang Kyun Lee, Seongnam-Si (KR); Won Jae Joo, Hwaseong-Si (KR); Chul Hee Kim, Incheon-Si (KR); Yoon Sok Kang, Seongnam-Si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 459 days.

(21) Appl. No.: 11/318,533

(22) Filed: Dec. 28, 2005

(65) Prior Publication Data

US 2006/0157691 A1  Jul. 20, 2006

(30) Foreign Application Priority Data

Dec. 28, 2004  (KR) .................. 10-2004-0113985

(51) Int. Cl.
H01L 51/05 (2006.01)
(52) U.S. Cl. ................. 257/40; 257/E51.027
(58) Field of Classification Search ........... 365/148; 257/2, 4, 5, 40, E51.027
See application file for complete search history.

(56) References Cited

U.S. PATENT DOCUMENTS

| 6,055,180 | A | 4/2000 | Gudesen et al. | |
| 6,528,815 | B1 * | 3/2003 | Brown et al. | 257/40 |
| 7,274,035 | B2 * | 9/2007 | Yang et al. | 257/27 |
| 2002/0163057 | A1 | 11/2002 | Bulovic et al. | |

FOREIGN PATENT DOCUMENTS

| EP | 0 569 038 | 11/1993 |
| EP | 1 465 201 | 10/2004 |
| EP | 1 513 159 | 3/2005 |
| JP | 62-95882 A | 5/1987 |

OTHER PUBLICATIONS

R.S. Potember et al., "Electrical Switching and Memory Phenomena in Cu-TCNQ Thin Films", Appl. Phys. Lett., vol. 34, No. 6, Mar. 15, 1979, pp. 405-407, American Institute of Physics (cited in specification).

Himadri S. Majumdar et al., "Conductance Switching and Data-Storage in Oriented Polymer-Based Devices: Impedance Characteristics", Thin Solid Films, vol. 446, 2004, pp. 296-300, Elsevier B.V. (cited in specification).

Himadri S. Majumdar et al., "Data-Storage Devices Based on Layer-By-Layer Self-Assembled Films of a Phthalocyanine Derivative", Organic Electronics, vol. 4, 2003, pp. 39-44, Elsevier Science B.V. (cited in specification).

Anirban Bandyopadhyay et al., "Large Conductance Switching and Memory Effects in Organic Molecules for Data-Storage Applications", Applied Physics Letters, vol. 82, No. 8, Feb. 24, 2003, pp. 1215-1217, American Institute of Physics (cited in specification).

Blackstock et al., "Electrical Switching and Memory Phenomena in Organic Multilayer Films" Internet Article, 2003, XP-002387511.

Gorman, "Encapsulated Electroactive Molecules" Advance Materials, 1997, vol. 9, No. 14, pp. 1117-1119, XP-000724225.

Nespurek et al., "Electroactive and Photochromic Molecular Materials for Wires, Switches and Memories" IEEE Engineering in Medecine & Biology, 1994, vol. 13, No. 1, pp. 45-57, XP-000442192.

Ouyang Jianyong et al., "Programmable Polymer Thin Film and Non-Volatile Memory Device" Nature, 2004, vol. 3, page complete, XP-002337279.

Szulczewski et al., "Growth and Characterization of Poly(arylamine) Thin Films Prepared by Vapor Deposition" Journal of Vacuum Science and Technology A., 2000, vol. 18, No. 4, pp. 1875-1880, XP-012005238.

European Office Action in Application No. 05 257 938.0-1233, dated Jul. 22, 2008.

European Search Report in Application No. 05 257 938.0-2210, dated Jul. 12, 2006.

Office Action dated Nov. 28, 2008 issued in Chinese Patent Application No. 2005101215694.

English Translation of Office Action dated Nov. 28, 2008 issued in Chinese Patent Application No. 2005101215694.

Li et al. "A Write-Once Organic Memory Made from Dendrimer Multilayers" http://www.mint.us.edu/pdf/reviews/fall%202002/34.pdf.

* cited by examiner

*Primary Examiner*—Evan Pert
(74) *Attorney, Agent, or Firm*—Harness, Dickey & Pierce, P.L.C.

(57) ABSTRACT

A memory device including an organic material layer between an upper electrode and a lower electrode. The organic material layer includes a dendrimer containing at least one electron-donating group and at least one electron-accepting group. The disclosed memory device is advantageous in that it shows a nonvolatile property, has high integration density and low power consumption characteristics, and may be inexpensively fabricated through a simple process.

17 Claims, 4 Drawing Sheets

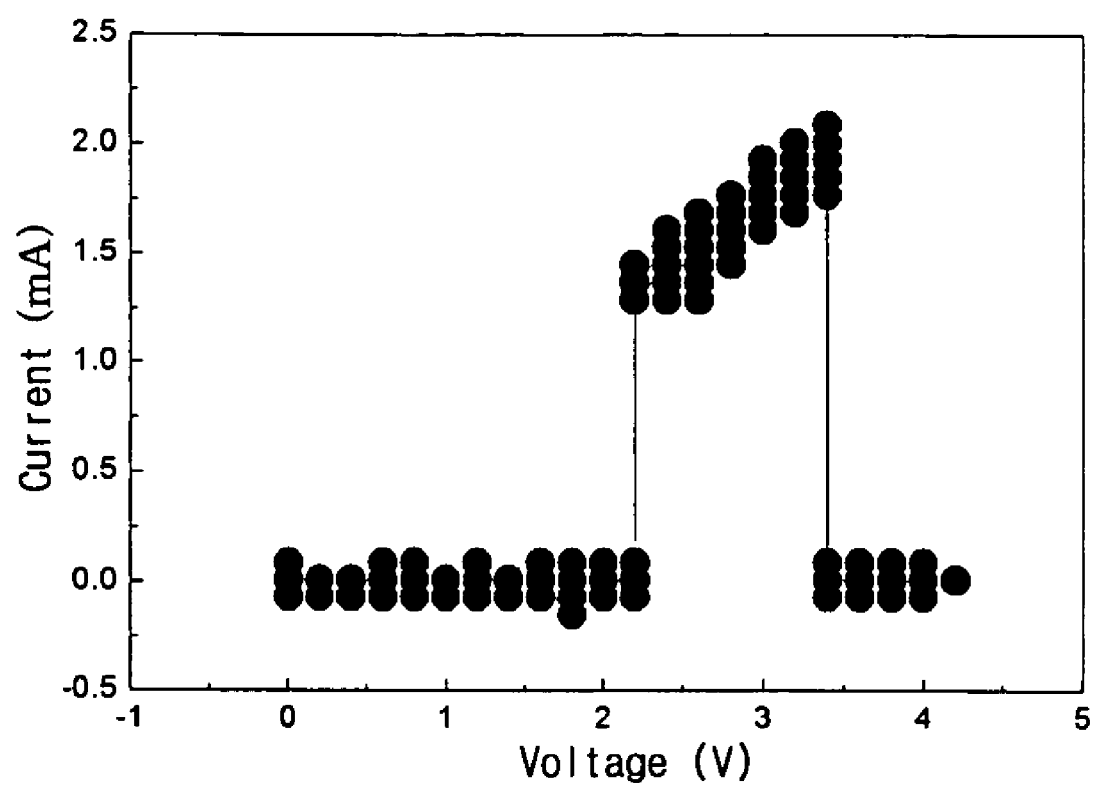

MEMORY DEVICE INCLUDING DENDRIMER

CROSS-REFERENCE TO RELATED PATENT APPLICATION

This non-provisional application claims priority under 35 U.S.C. § 119(a) to Korean Patent Application No.2004-113985 filed on Dec. 28, 2004 which is herein incorporated by reference.

BACKGROUND OF THE INVENTION

1. Field of the Invention

Embodiments of the present invention relate to a memory device, and preferred embodiments relate more particularly to a memory device having nonvolatility, low price, high integration density and low power consumption characteristics, which comprises a dendrimer as a material having memory characteristics between an upper electrode and a lower electrode, in which the dendrimer contains at least one electron-donating group and at least one electron-accepting group.

2. Description of the Prior Art

Recently, with the remarkable development of the information communication industry, the demand for various memory devices is rapidly increasing. Particularly, memory devices required in handy terminals, various smart cards, electronic cash, digital cameras, MP3 players, etc., require nonvolatility, meaning that even when the power is turned off, the written information is typically not erased.

With the development of large-scale integration (LSI) technology, the number of memory bits in an IC chip reaches the megabit level so that lines and spaces on the submicron order are required. Most existing nonvolatile memories are based on the standard silicon processing, but these silicon-based devices have a problem in the realization of high capacity because their structure is complicated, making the size of one memory cell large. Also, for these silicon-based memories, high memory capacity can be obtained only by a microfabrication process of reducing line and space per unit area, in which case it is expected that it will be faced with the problem of non-profitability because an increase in process cost will lead to an increase in the production cost of memory chips, and chips can no longer be miniaturized due to technical limitations.

Accordingly, the development of next-generation memory having ultrahigh speed, large capacity and low powder consumption characteristics, which is capable of substituting for the existing memory and is suitable for the development of portable information communication systems and devices for wirelessly processing large-amount of information, is being actively conducted.

The next-generation memory is divided, according to the material of a cell, a fundamental unit within a semiconductor, into ferroelectric RAM, magnetic RAM, phase change RAM, nanotube RAM, holographic memory, organic memory, etc.

Among them, organic memory exhibits memory characteristics using bistability shown when applying voltage to an organic material sandwiched between upper and lower electrodes. Such organic memory can realize a nonvolatile property, the advantage of existing flash memory, while overcoming the problems of processibility of existing flash memory, production cost and integration density noted as shortcomings, and thus, they are receiving great attention as the next generation memory.

In 1979, Potember et al. first reported electrical switching and memory phenomena at the nanosecond speed using CuTCNQ (7,7,8,8-tetracyano-p-quinodimethane), an organometallic charge transfer complex [Appl. Phys. Lett., 34 (1979) 405]. Japanese patent laid-open No. Sho 62-956882 discloses an electrical memory device including CuTCNQ, etc. This memory device has no advantage in terms of a process since it cannot be fabricated by means of a simple method, such as spin coating, instead it can be fabricated only by thermal evaporation with the use of an expensive vaporizer, due to the use of single molecules.

Organic materials known to show electrical bistability upon the application of an electric field include, in addition to the charge transfer materials, conductive polymers [Thin Solid Film 446 (2004) 296-300]. Also, memory characteristics using a phthalocyanine-based compound, an organic dye, were reported [Organic Electronics 10 4 (2003) 3944]. Also, switching/memory characteristics using a conformational change in an oxidation-reduction reaction and an electric field are known [Applied Physics Letter 82 (2003) 1215].

U.S. patent publication No. 2002-163057 discloses a semiconductor device comprising an interlayer between upper and lower electrodes, in which the interlayer is formed of a conductive polymer containing an ionic salt, such as NaCl or CsCl. This device shows switching/memory characteristics using a charge separation phenomenon caused by an electric field. However, while the conductive polymer can be spin-coated, but it is difficult to realize precise molecular weight and distribution thereof, leading to a problem in the reproducibility of material characteristics. Thus, uniform device performance cannot be realized.

U.S. Pat. No. 6,055,180 discloses a memory device using ferroelectricity caused by the crystalline state of a fluorine-based polymer, such as poly(vinyldifluoroethylene). However, the fluorine-based polymer has a problem in that it is difficult to coat due to the hydrophobic property of fluorine, leading to a reduction in processibility. Another problem is that recording of information is possible only one time and the reading of stored information is optically conducted, leading to an increase in the size and complexity of devices.

OBJECTS AND SUMMARY

Accordingly, embodiments of the present invention have been made in view of the above problems, and an object of embodiments of the present invention is to provide a memory device which has a nonvolatile property and at the same time, can be fabricated using a simple process in an inexpensive manner.

Another object of embodiments of the present invention is to provide a nonvolatile memory device having high integration density, low power consumption and high speed switching characteristics.

To achieve the above objects, according to an embodiment of the present invention, a memory device comprising an organic material layer between an upper electrode and a lower electrode is provided, in which the organic material layer comprises a dendrimer containing at least one electron-donating group and at least one electron-accepting group.

According to another embodiment of the present invention, the organic material layer used in the embodiments of the present invention may comprise, in addition to the dendrimer, at least one or both of an electron-donating compound and an electron-accepting compound.

BRIEF DESCRIPTION OF THE DRAWINGS

The above and other objects, features and advantages of the embodiments of the present invention will be more clearly understood from the following detailed description taken in conjunction with the accompanying drawings, in which:

FIG. 7 is a graphic diagram showing the current-voltage (I-V) characteristic of a memory device fabricated in example 3.

DETAILED DESCRIPTION OF THE PREFERRED EMBODIMENTS

Hereinafter, embodiments of the present invention will be described in more detail with reference to the appended drawings.

Figure 1:
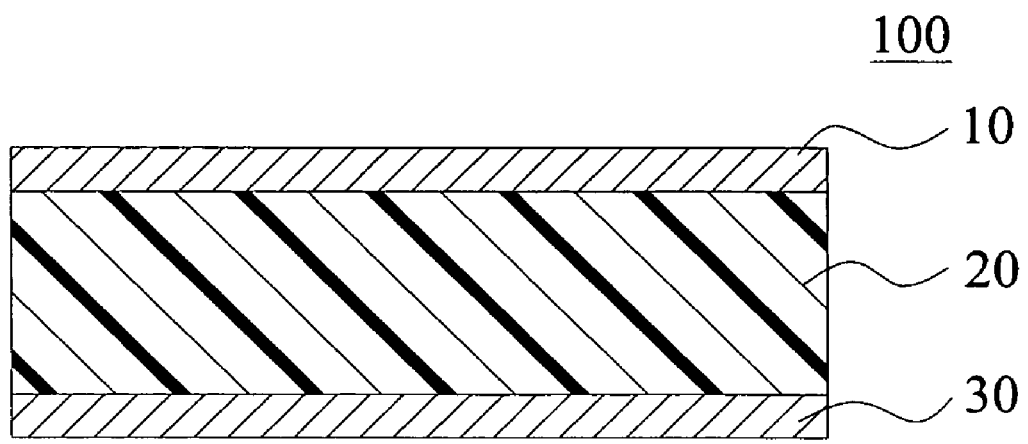
FIG. 1 is a cross-sectional schematic view of a memory device according to an embodiment of the present invention.

FIG. 1 is a cross-sectional schematic view of a memory device according to an embodiment of the present invention. Referring to FIG. 1, a memory device 100 according to an embodiment of the present invention comprises an organic material layer 20 sandwiched between an upper electrode 10 and a lower electrode 30, in which the organic material layer 20 comprises a dendrimer containing at least one electron-donating group and at least one electron-accepting group. When voltage is applied to this memory device, the resistance value of the organic material layer shows bistability, thus exhibiting memory characteristics. Such memory characteristics are shown due to the characteristics of the organic material to typically remain intact even in the absence of power to the electrodes. Accordingly, the inventive memory device has a nonvolatile property.

In the embodiments of the present invention, the organic material layer 20 may comprise a dendrimer. This dendrimer is excellent in a coating property, can ensure the precise chemical structure of material, and can provide memory characteristics owing to charge trapping. The dendrimer molecule is empty in the center, and its outer portion includes reactive groups capable of reacting with various chemical units.

The dendrimer used in the embodiments of the present invention may contain at least one electron-donating group and at least one electron-accepting group for the provision of memory characteristics, and preferably may have a molecular weight of about 500-100,000. The dendrimer will show an increase in generation when a structure of constantly repeating units is added, and it has an advantage in that its molecular weight or surface functional groups can be perfectly controlled during its synthesis process, unlike other polymers.

The dendrimer may be synthesized either by divergent synthesis in which the dendrimer grows outwards from the core, or by convergent synthesis in which the synthesis is started peripherally and is concluded around the core.

The electron-donating group of the dendrimer used in embodiments of the present invention is preferably selected from the group consisting of an aromatic amine group, tetracene, pentacene, rubrene, perylene, pyranylidene, tetrachalcogenafulvalene, tetrathiafulvalene, tetrathionaphthalene, tetraselenaperylene, and derivatives thereof, but is not limited thereto.

The electron-accepting group of the dendrimer used in the embodiments of the present invention may be preferably selected from the group consisting of tetracyanoquinodimethane, tetracyanoethylene, dichlorodicyano-p-benzoquinone, dithiolene metal complexes, C60, and derivatives thereof.

The organic material layer 20 in the embodiments of the present invention may be formed by various methods, such as spin coating, inkjet printing, roll-to-roll coating, and thermal evaporation. The thickness of the organic material layer 20 is preferably about 50-3,000 Å.

In another embodiment of the present invention, the organic material layer 20 may further comprise, in addition to the dendrimer containing at least one electron-donating group and at least one electron-accepting group, at least one or both of an electron-donating compound and an electron-accepting compound. In this embodiment, the electron-donating compound and the electron-accepting compound can be selected from the compounds exemplified above as the above electron-donating or electron-accepting group but existing independently without binding to the dendrimer.

Accordingly, the electron-donating compound may be preferably selected from the group consisting of tetracene, pentacene, rubrene, perylene, pyranylidene, tetrachalcogenafulvalene, tetrathiafulvalene, tetrathionaphthalene, tetraselenaperylene, and derivatives thereof.

Meanwhile, the electron-accepting compound may be preferably selected from the group consisting of tetracyanoquinodimethane, tetracyanoethylene, dichlorodicyano-p-benzoquinone, dithiolene metal complexes, C60, and derivatives thereof.

In the embodiments of the present invention, the upper electrode 10 and the lower electrode 30 comprise at least one electroconductive material selected from the group consisting of metals, metal alloys, metal nitrides, metal oxides, metal sulfides, carbon and conductive polymers, and organic conductors. Preferred examples of the electrode material include, but are not limited to, gold (Au), silver (Ag), iron (Fe), platinum (Pt), aluminum (Al), copper (Cu), titanium (Ti), tungsten (W), indium tin oxide, potassium, zinc, and magnesium. When the electrodes in the present invention are formed of organic materials, a memory device formed completely of organic materials can also be obtained.

Preferred examples of the conductive polymers include, but are not limited to, polyacetylene polymers, such as polydiphenylacetylene, poly(t-butyl)diphenylacetylene, poly(trifluoromethyl)diphenylacetylene, poly(bistrifluoromethyl)

acetylene, polybis(t-butyldiphenyl)acetylene, poly(trimethylsilyl)diphenylacetylene, poly(carbazol)diphenylacetylene, polydiacetylene, polyphenylacetylene, polypyridineacetylene, polymethoxyphenylacetylene, polymethylphenylacetylene, poly(t-butyl)phenylacetylene, polynitrophenylacetylene, poly(trifluoromethyl)phenylacetylene, poly(trimethylsilyl)phenylacetylene, and derivatives thereof. Other examples of the conductive polymers which can be used in the embodiments of the present invention include polyaniline, polythiophene, polypyrrole, polysilane, polystyrene, polyfuran, polyindole, polyazulene, polyphenylene, polypyridine, polybipyridine, polyphthalocyanine, poly(ethylenedioxythiophene), and derivatives thereof.

The upper electrode 10 and the lower electrode 30 may be formed by conventional methods, such as evaporation (e.g., thermal evaporation), sputtering, and e-beam evaporation.

Figure 2:
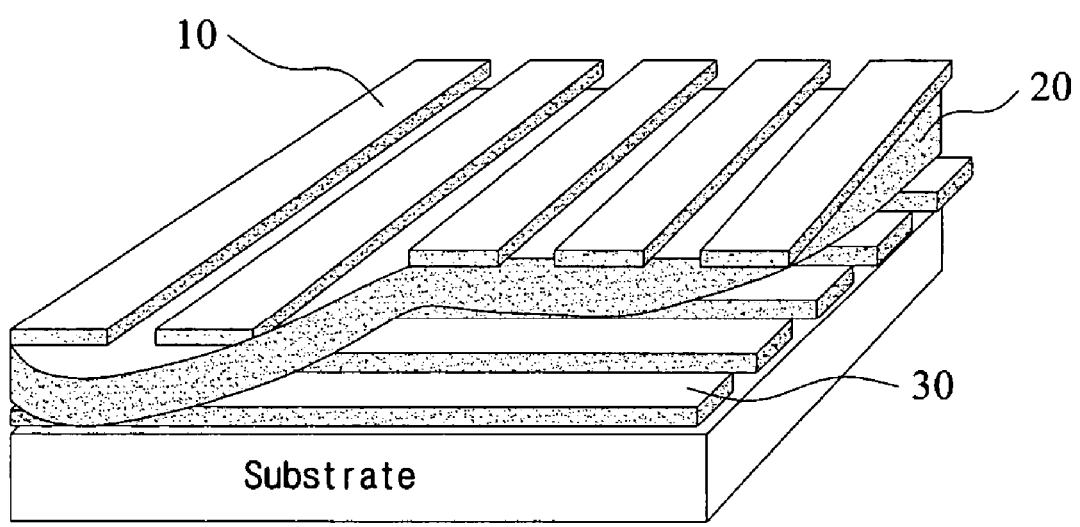
FIG. 2 is a perspective view of a memory matrix according to an embodiment of the present invention.

FIG. 2 shows an example of a memory matrix according to an embodiment of the present invention. As shown in FIG. 2, the memory matrix is deposited on a suitable substrate made of, for example, glass or silicon. This memory matrix includes the upper electrode 10, the lower electrode 30, and the organic material layer 20 sandwiched between the electrodes. The substrate used in this case may be an conventional organic or inorganic substrate, particularly a flexible substrate. Cells formed at the cross points between the upper electrode 10 and the lower electrode 30 may provide a bistable property.

Figure 3:
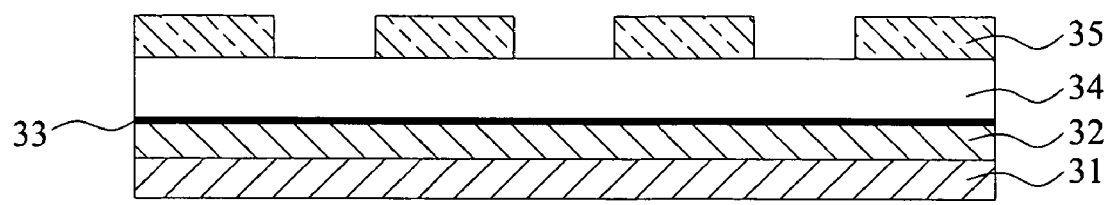
FIG. 3 is a cross-sectional schematic view of a memory device according to another embodiment of the present invention.
Figure 4:
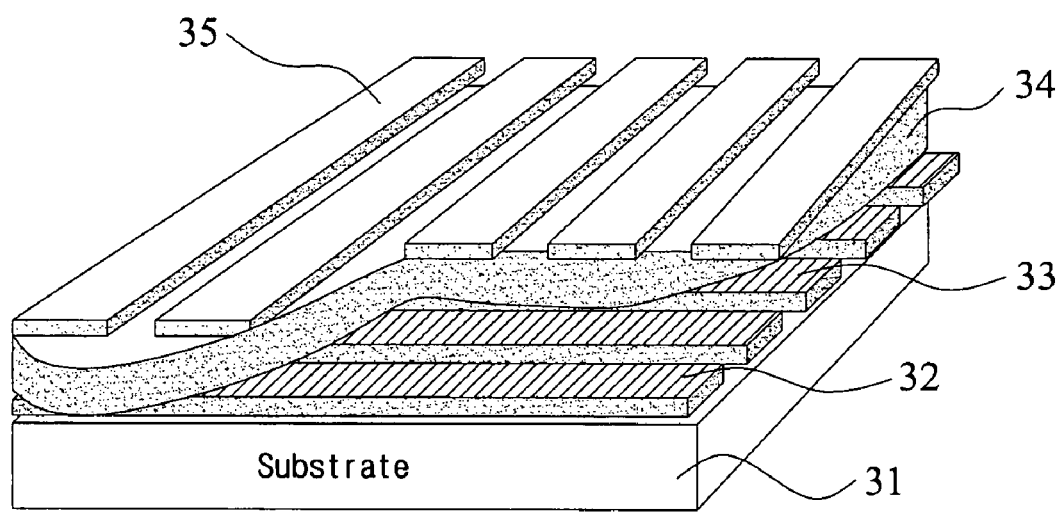
FIG. 4 is a perspective view of a memory matrix according to another embodiment of the present invention.

In a preferred embodiment of the present invention, a memory device may further comprise a barrier layer below the upper electrode or above the lower electrode in order to protect the electrodes. FIG. 3 is a cross-sectional view of a memory device having a barrier layer formed therein, and FIG. 4 is a perspective view of a memory matrix according to the embodiment of FIG. 3. As shown in FIGS. 3 and 4, on a substrate 31, lower electrode 32 and barrier layer 33 are sequentially formed. On the barrier layer 33, an organic material layer 34 and upper electrode 35 are sequentially formed. The barrier layer 33 comprises a material selected from the group consisting of $SiO_x$, $AlO_x$, $NbO_x$, $TiO_x$, $CrO_x$, $VO_x$, $TaO_x$, $CuO_x$, $MgO_x$, $WO_x$, and $AlNO_x$. Preferred examples of the material of the barrier layer 33 include $SiO_2$, $Al_2O_3$, $Cu_2O$, $TiO_2$, BN, and $V_2O_3$. The thickness of the barrier layer is preferably in a range of 20-300 Å.

Hereinafter, the embodiments of the present invention will be described in more detail using examples. It is to be understood, however, that these examples are for illustrative purposes only and are not to be construed to limit the scope of the present invention.

EXAMPLE 1

0.1 g of tris(4-(3,5-bis(4-(4,6-bis(4-t-butylphenyl)-1,3,5-triazine-2-yl)styryl)styryl)phenyl)amine of the following formula 1, as a dendrimer, was dissolved in dichloromethane. The resulting solution was filtered through a microsyringe filter having a pore size of 0.2 μm to prepare a coating solution. Then, the coating solution was applied by spin-coating on a glass substrate deposited with ITO (Indium Tin Oxide), and baked at 80° C. to remove the solvent. The thickness of the resulting coating film was adjusted to about 10-100 nm using an Alpha-tep profilometer. As an upper electrode, copper was deposited by thermal evaporation, and the thickness of the deposited electrode was adjusted by a quartz crystal monitor.

Figure 5:
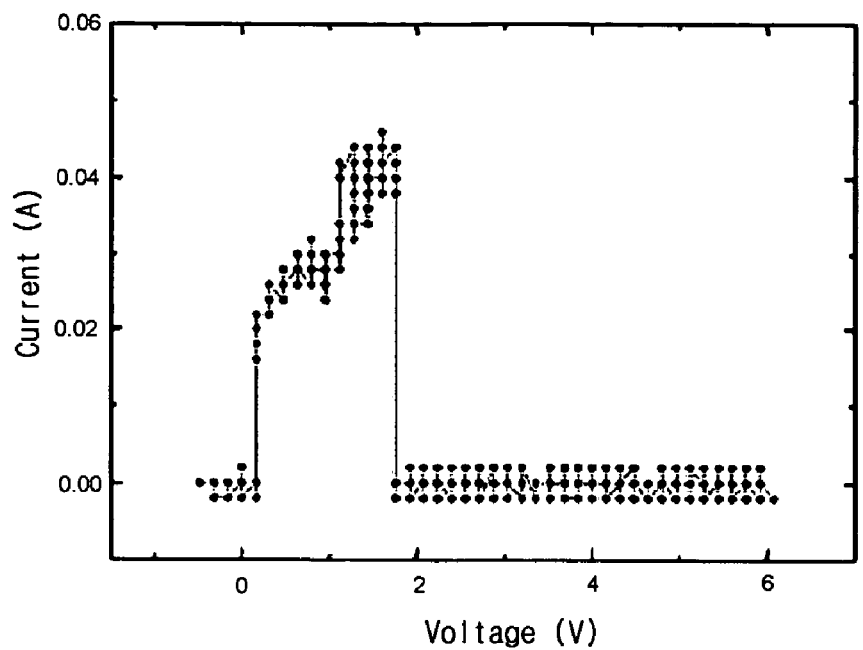
FIG. 5 is a graphic diagram showing the current-voltage (I-V) characteristic of a memory device fabricated in example 1.

FIG. 5 shows the current-voltage (I-V) curve of a memory device fabricated by the method of Example 1. Voltage scanning was done at 0.1 volt/sweep. Referring to FIG. 5, in the first bias sweep, the device was put in a set state with a rapid increase in current at around 0.3 V, and then, in a reset state with a rapid decrease in current at 1.8 V. The currents between the set state and the reset state showed a great difference of 2 orders. When this device was swept for the second time after removing voltage in a set state, it maintained a low-current state even at low voltage. These results suggest that the inventive memory device can be used as nonvolatile memory because it shows bistability with two resistance values at the same applied voltage.

[Formula 1]

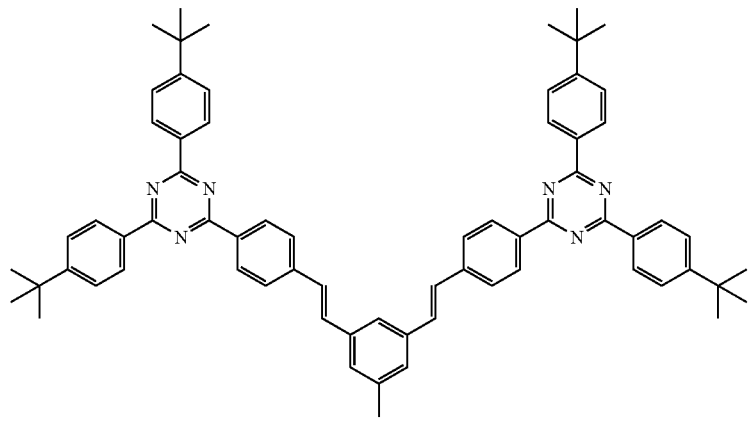

-continued

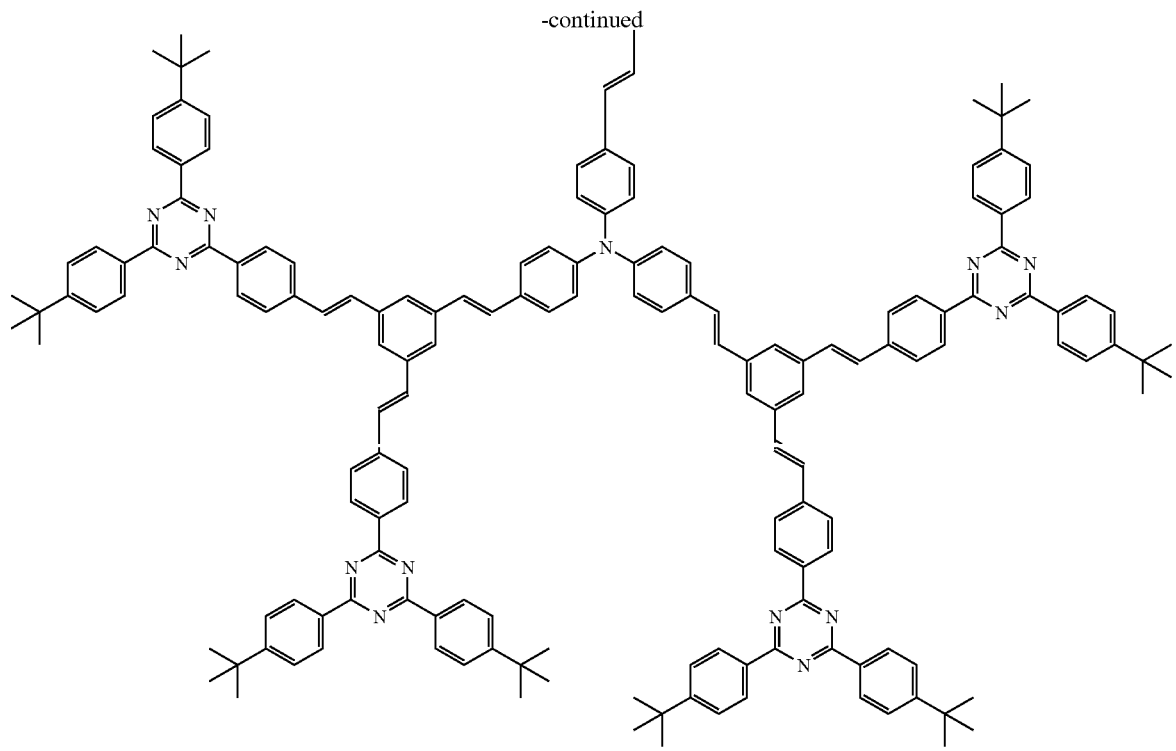

EXAMPLE 2

0.1 g of tris(4-(4-(4,6-bis(4-t-butylphenyl)-1,3,5-triazine-2-yl)styryl)phenyl)amine of the following formula 2, as a dendrimer, and 0.2 g of tetracyanodiquinomethane of the following formula 3, as an electron-accepting material, were dissolved in dichloromethane. The solution was filtered through a microsyringe filter having a pore size of 0.2 μm to prepare a coating solution. Then, the coating solution was applied by spin-coating on a glass substrate deposited with ITO (Indium Tin Oxide), and baked at 80° C. to remove the solvent. The thickness of the resulting coating film was adjusted to about 10-100 nm using an Alpha-Step profilometer. As an upper electrode, copper was deposited by thermal evaporation, and the thickness of the deposited electrode was adjusted by a quartz crystal monitor.

[Formula 2]

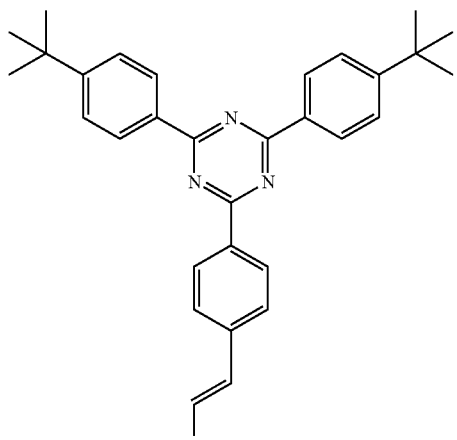

-continued

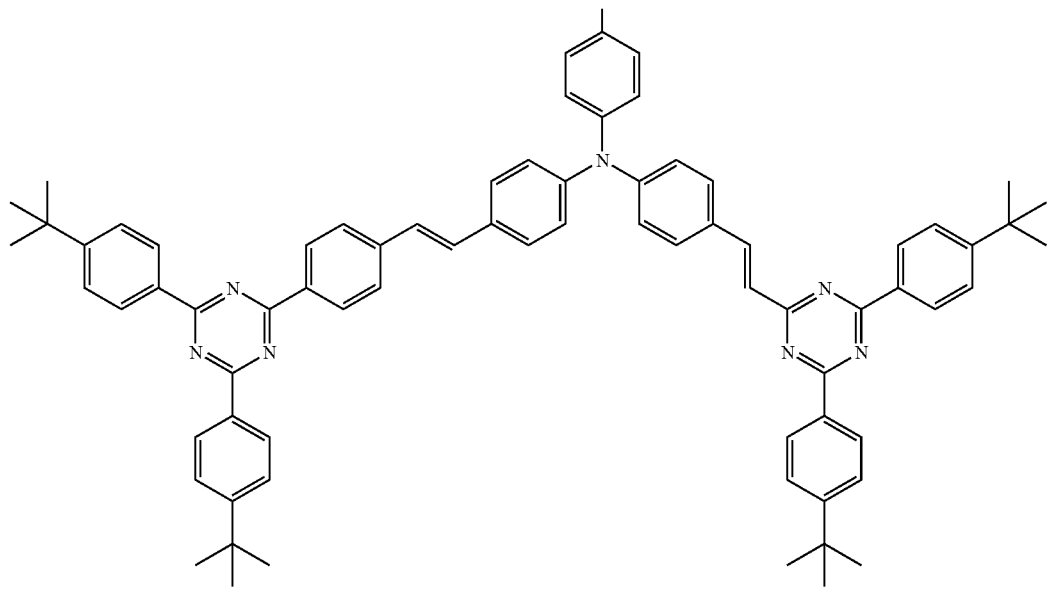

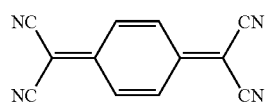

[Formula 3]

Figure 6:
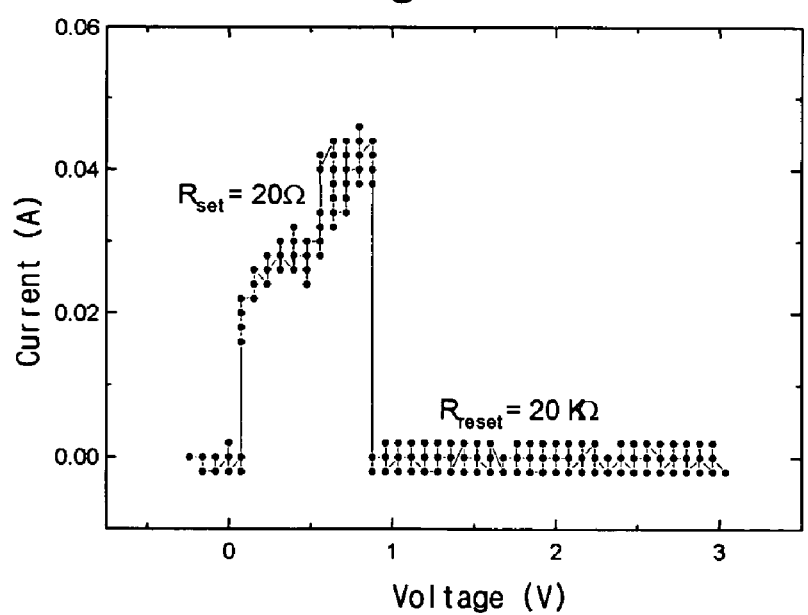
FIG. 6 is a graphic diagram showing the current-voltage (I-V) characteristic of a memory device fabricated in example 2.

FIG. 6 shows the current-voltage (I-V) curve of the device fabricated in Example 2. The results shown in FIG. 6 demonstrate the bistability of the inventive memory device and its utility as a nonvolatile memory device.

EXAMPLE 3

0.3 g of N-(4-(4-(4,6-bis(4-(4-(bis(4-(4-(4,6-bis(4-t-butylphenyl)-1,3,5-triazin-yl)styryl)phenyl)amino)styryl)phenyl)-1,3,5-triazin-2-yl)styryl)phenyl)4-(4-(4,6-bis(4-t-butylphenyl)-1,3,5-triazin-2-yl)styryl)-N-(4-(4-(4,6-bis(4-t-butylphenyl)-1,3,5-triazin-2-yl)styryl)phenyl)benzeneamine of the following formula 4, as a dendrimer, and 0.05 g of dichlorodicyano-p-benzoquinone as an electron-accepting material, were dissolved in dichloromethane. The solution was filtered through a microsyringe filter having a pore size of 0.2 μm to prepare a coating solution. Then, the coating solution was spin-coated on a glass substrate deposited with ITO (Indium Tin Oxide), and baked at 80° C. to remove the solvent. The thickness of the resulting coating film was adjusted to about 10-100 nm using an Alpha-tep profilometer. As an upper electrode, copper was deposited by thermal evaporation, and the thickness of the deposited electrode was adjusted using a quartz crystal monitor.

[Formulla 4]
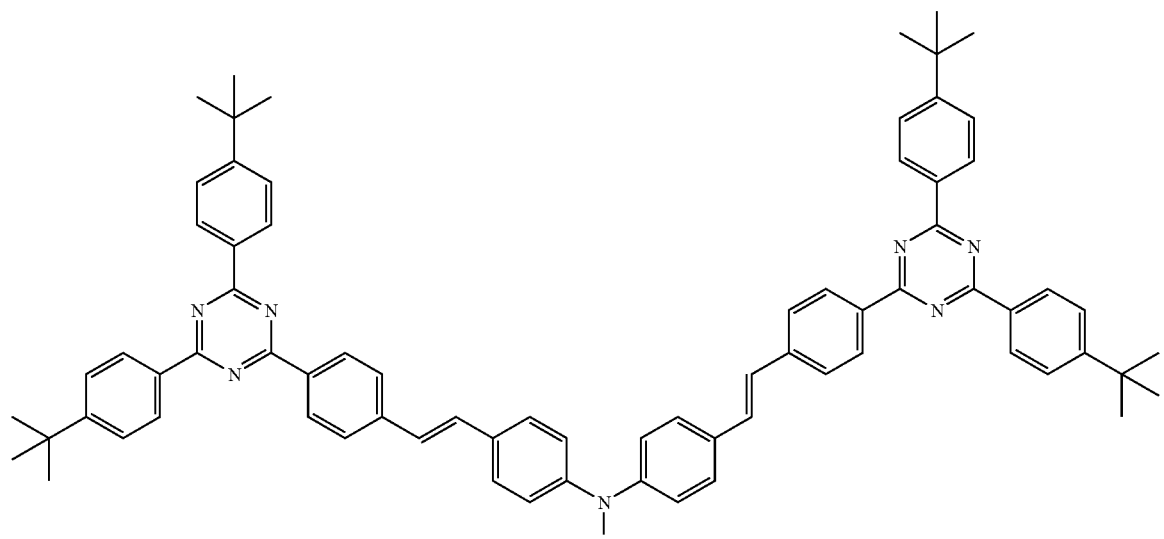
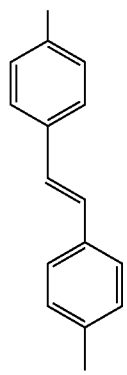
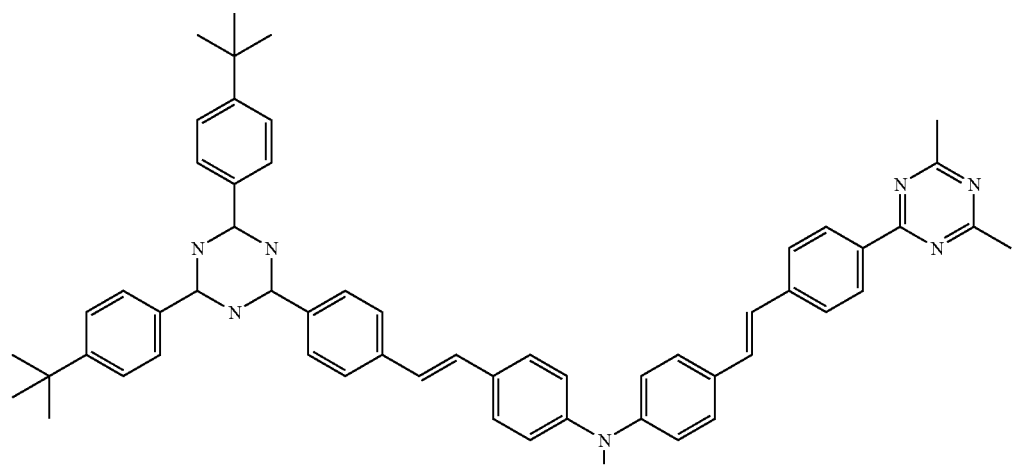

-continued
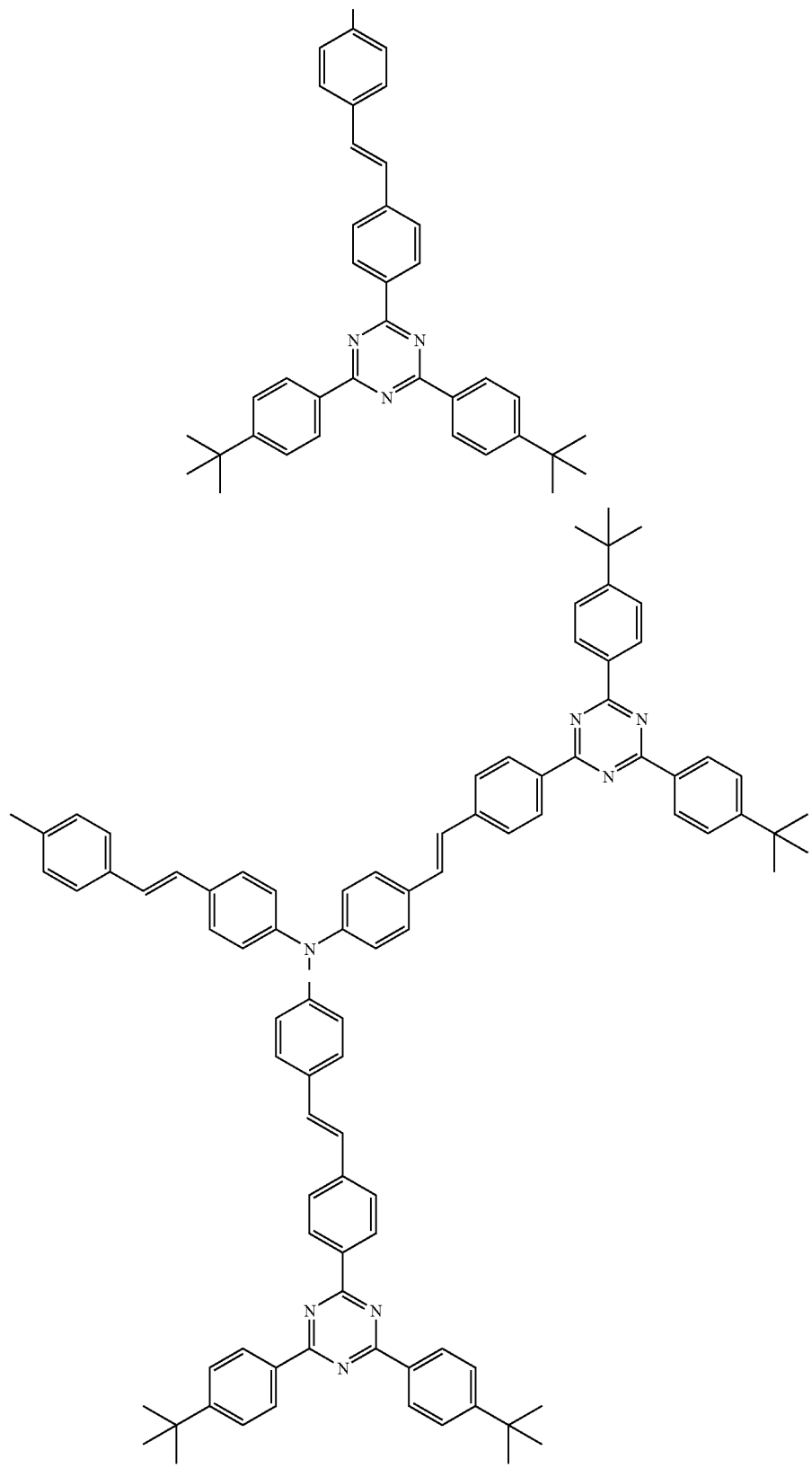

FIG. 7 shows the current-voltage (I-V) curve of a memory device fabricated in Example 3. The results shown in FIG. 7 demonstrate the bistability of the inventive memory device and its utility as a nonvolatile memory device.

As described above, the organic memory device according to the embodiments of the present invention is advantageous in that it has a nonvolatile property, has high integration density to allow the realization of high capacity, and can be fabricated through a simple process in an inexpensive manner. Also, it has an advantage in that it can be driven at low voltage and low current, leading to a reduction in power consumption.

Although a preferred embodiment of the present invention has been described for illustrative purposes, those skilled in the art will appreciate that various modifications, additions and substitutions are possible, without departing from the scope and spirit of the invention as disclosed in the accompanying claims.

What is claimed is:

1. A memory device comprising an organic material layer between an upper electrode and a lower electrode, in which the organic material layer comprises a dendrimer having at least one electron-donating group and at least one electron-accepting group.

2. The memory device of claim 1, wherein the organic material layer further comprises, in addition to the dendrimer, one or both of an electron-donating compound and an electron-accepting compound.

3. The memory device of claim 1, further comprising a barrier layer above the lower electrode or below the upper electrode.

4. The memory device of claim 1, wherein the dendrimer has a molecular weight of 500-100,000.

5. The memory device of claim 1, wherein the electron-donating group in the dendrimer is selected from the group consisting of an aromatic amine group, tetracene, pentacene, rubrene, perylene, pyranylidene, tetrachalcogenafulvalene, tetrathiafulvalene, tetrathionaphthalene, tetraselenaperylene, and derivatives thereof.

6. The memory device of claim 5, wherein the electron-donating group is the aromatic amine group.

7. The memory device of claim 1, wherein the electron-accepting group is selected from the group consisting of tetracyanoquinodimethane, tetracyanoethylene, dichlorodicyano-p-benzoquinone, dithiolene metal complexes, C60, and derivatives thereof.

8. The memory device of claim 2, wherein the electron-donating compound is selected from the group consisting of tetracene, pentacene, rubrene, perylene, pyranylidene, tetrachalcogenafulvalene, tetrathiafulvalene, tetrathionaphthalene, tetraselenaperylene, and derivatives thereof.

9. The memory device of claim 2, wherein the electron-accepting compound is selected from the group consisting of tetracyanoquinodimethane, tetracyanoethylene, dichlorodicyano-p-benzoquinone, dithiolene metal complexes, C60, and derivatives thereof.

10. The memory device of claim 1, wherein the electrodes comprise a material selected from the group consisting of metals, metal oxides, metal nitrides, metal sulfides, carbon, conductive polymers, and organic conductors.

11. The memory device of claim 10, wherein the material of the electrodes is selected from the group consisting of gold, silver, iron, platinum, aluminum, copper, titanium, tungsten, indium tin oxide, potassium, zinc, and magnesium.

12. The memory device of claim 10, wherein the conductive polymers are selected from the group consisting of polydiphenylacetylene, poly(t-butyl)diphenylacetylene, poly(trifluoromethyl)diphenylacetylene, poly(bistrifluoromethyl)acetylene, polybis(t-butyldiphenyl)acetylene, poly(trimethylsilyl)diphenylacetylene, poly(carbazol)diphenylacetylene, polydiacetylene, polyphenylacetylene, polypyridineacetylene, polymethoxyphenylacetylene, polymethylphenylacetylene, poly(t-butyl)phenylacetylene, polynitrophenylacetylene, poly(trifluoromethyl)phenylacetylene, poly(trimethylsilyl)phenylacetylene, polyaniline, polythiophene, polypyrrole, polysilane, polystyrene, polyfuran, polyindole, polyazulene, polyphenylene, polypyridine, polybipyridine, polyphthalocyanine, poly(ethylenedioxythiophene), and derivatives thereof.

13. The memory device of claim 3, wherein the barrier layer comprises a material selected from the group consisting of $SiO_x$, $AlO_x$, $NbO_x$, $TiO_x$, $CrO_x$, $VO_x$, $TaO_x$, $CuO_x$, $MgO_x$, $WO_x$, and $AlNO_x$.

14. The memory device of claim 13, wherein the barrier layer comprises a material selected from the group consisting of $SiO_2$, $Al_2O_3$, $Cu_2O$, $TiO_2$, $BN$, and $V_2O_3$.

15. The memory device of claim 1, wherein the organic material layer has a thickness of about 50-3,000 Å.

16. The memory device of claim 3, wherein the barrier layer has a thickness of about 20-300 Å.

17. The memory device of 1, wherein the upper and lower electrodes and the organic material layer all comprise organic materials.

* * * * *